United States Patent
Chuang et al.

(10) Patent No.: US 8,569,759 B2
(45) Date of Patent: Oct. 29, 2013

(54) ACTIVE DEVICE ARRAY SUBSTRATE AND REPAIRING METHOD THEREOF

(75) Inventors: Wen-Chi Chuang, Taipei County (TW); Chung-Hung Peng, Miaoli County (TW); Tung-Tsun Lin, Tainan City (TW); Ya-Ling Kuo, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 504 days.

(21) Appl. No.: 12/824,237

(22) Filed: Jun. 28, 2010

(65) Prior Publication Data

US 2011/0278574 A1 Nov. 17, 2011

(30) Foreign Application Priority Data

May 17, 2010 (TW) .............................. 99115694 A

(51) Int. Cl.
*H01L 29/04* (2006.01)
*H01L 29/10* (2006.01)
*H01L 31/00* (2006.01)

(52) U.S. Cl.
USPC ........ 257/59; 257/72; 257/E27.132; 438/149; 349/54

(58) Field of Classification Search
USPC ...................... 257/59, 72, E27.111, E27.132, 257/E29.273, E29.291; 438/149, 151; 349/54
See application file for complete search history.

(56) References Cited

U.S. PATENT DOCUMENTS

| 8,003,988 | B2 * | 8/2011 | Jeon | 257/59 |
| 8,411,217 | B2 * | 4/2013 | Liu et al. | 349/40 |
| 2007/0029615 | A1 * | 2/2007 | Lai | 257/355 |
| 2007/0046845 | A1 * | 3/2007 | Liou et al. | 349/40 |
| 2010/0238368 | A1 * | 9/2010 | Kim et al. | 349/40 |

FOREIGN PATENT DOCUMENTS

| TW | 446831 | 7/2001 |
| TW | I244193 | 11/2005 |
| TW | I271847 | 1/2007 |
| TW | 200707047 | 2/2007 |
| TW | I304146 | 12/2008 |

OTHER PUBLICATIONS

"Office Action of Taiwan counterpart application" issued on Jan. 28, 2013, p. 1-p. 7.

* cited by examiner

*Primary Examiner* — Benjamin Sandvik
*Assistant Examiner* — Leslie Pilar Cruz
(74) *Attorney, Agent, or Firm* — Jianq Chyun IP Office

(57) ABSTRACT

An active device array substrate including a substrate, a plurality of pixels, a plurality of signal lines, and a repairing structure is provided. The substrate has a display region and a periphery region. The pixels are arranged on the display region of the substrate as an array. The signal lines are electrically connected to the pixels and are respectively extended from the display region to the periphery region. The repairing structure is disposed at the periphery region, and which includes a first repairing line, a second repairing line, an electrostatic discharge (ESD) releasing line, and an ESD protector. The first repairing line is intersected with one ends of the signal lines and is electrically floated. The ESD protector is connected between the second repairing line and the ESD releasing line, and the ESD protector is overlapped with and electrically insulated from the first repairing line.

18 Claims, 8 Drawing Sheets

ACTIVE DEVICE ARRAY SUBSTRATE AND REPAIRING METHOD THEREOF

CROSS-REFERENCE TO RELATED APPLICATION

This application claims the priority benefit of Taiwan application serial no. 99115694, filed on May 17, 2010. The entirety of the above-mentioned patent application is hereby incorporated by reference herein and made a part of specification.

BACKGROUND OF THE INVENTION

1. Field of the Invention

The present invention generally relates to an array substrate and a repairing method thereof, and more particularly, to an active device array substrate and a repairing method thereof.

2. Description of Related Art

In a flat panel display, pixels are arranged into an array and display images under the control of two sets of perpendicularly disposed signal lines. The design with scan lines and data lines is the most commonly adopted design among all image control modes. The scan lines and the data lines are perpendicular to each other so as to define a plurality of pixels. The scan lines are sequentially activated to turn on or turn off the corresponding switch devices, so that signals transmitted on the data lines can be written into the pixels and accordingly the display conditions of the corresponding pixels can be changed.

Even though the flat panel display technology has matured gradually, some defects may still be occurred on components (for example, an active device array substrate) of a flat panel display when the flat panel display is manufactured. For example, the scan lines and data lines on an active device array substrate are very long and open defects may be occurred. When open defects are occurred in a scan line or a data line, some pixels arranged in a same row or arranged in a same column malfunctions and line defect may occurred. Thus, any open defect should be repaired. In addition, it is very difficult to achieve a minimal defect rate by simply improving the manufacturing process. Thus, a repairing structure and a defect repairing technique in an active device array substrate have become necessary. Conventionally, defects in an active device array substrate are usually repaired through laser welding and/or laser cutting.

Generally speaking, at least one repairing line is usually preserved on an active device array substrate in order to repair any open defect instantly. Normally, the repairing line is intersected with the signal lines with welding points and is electrically insulated from the signal lines. When an open defect is occurred on a signal line and accordingly the signal line is broken, two ends of the signal line having open defect are respectively welded to the repairing line through welding points so that the signal line having open defect can remain connected through the repairing line and the corresponding pixels can function properly.

In other words, the repairing line is normally electrically floated and electrically insulated from the signal lines, and it is only electrically connected to a signal line (so as to keep the signal line active) through laser welding when the signal line is broken. However, it should be noted that the signal lines and the repairing line may be damaged by electrostatic discharge (ESD) and short circuited. As a result, the display quality of the active device array substrate may be affected, and even worse, the active device array substrate may be declared no longer serviceable.

SUMMARY OF THE INVENTION

Accordingly, the present invention is directed to an active device array substrate, wherein signal lines and repairing lines are protected from electrostatic discharge (ESD) so that the active device array substrate can have an improved electric characteristic.

The present invention is also directed to a repairing method for the aforementioned active device array substrate, wherein broken signal lines are repaired to ensure the proper operation of the pixels.

The present invention provides an active device array substrate including a substrate, a plurality of pixels, a plurality of signal lines, and a repairing structure. The substrate has a display region and a periphery region. The pixels are arranged on the display region of the substrate as an array. The signal lines are electrically connected to the pixels and respectively extended from the display region to the periphery region. The repairing structure is disposed at the periphery region, and the repairing structure includes a first repairing line, a second repairing line, an ESD releasing line, and an ESD protector. The first repairing line is intersected with one ends of the signal lines and is electrically floated. The ESD protector is connected between the second repairing line and the ESD releasing line, and the ESD protector is overlapped with and electrically insulated from the first repairing line.

The present invention also provides a repairing method suitable for repairing aforementioned active device array substrate. The repairing method includes following steps when an open defect is occurred on one of the signal lines. The first repairing line is welded to one end of the signal line having the open defect. The ESD protector is welded to the first repairing line at where the ESD protector is overlapped with the first repairing line, wherein the second repairing line is electrically connected to the signal line having the open defect through the ESD protector and the first repairing line.

The present invention provides another active device array substrate including a substrate, a plurality of pixels, a plurality of signal lines, and a repairing structure. The substrate has a display region and a periphery region. The pixels are arranged on the display region of the substrate as an array. The signal lines are electrically connected to the pixels and respectively extended from the display region to the periphery region, and one of the signal lines has an open defect. The repairing structure is disposed at the periphery region, and the repairing structure includes a first repairing line, a second repairing line, an ESD releasing line, and an ESD protector. The first repairing line is intersected with one ends of the signal lines and is electrically floated. The ESD protector is electrically connected between the second repairing line and the ESD releasing line, and the ESD protector is overlapped with and electrically insulated from the first repairing line, wherein there is at least one welding point at where the first repairing line is overlapped with one end of the signal line having the open defect and at least one welding point at wherein the ESD protector is overlapped with the first repairing line, such that the second repairing line is electrically connected to the signal line having the open defect through the ESD protector and the first repairing line.

The present invention provides yet another active device array substrate including a substrate, a plurality of pixels, a plurality of signal lines, and a repairing structure. The substrate has a display region and a periphery region. The pixels are arranged on the display region of the substrate as an array. The signal lines are electrically connected to the pixels and respectively extended from the display region to the periphery region, and one of the signal lines has an open defect. The repairing structure is disposed at the periphery region, and the repairing structure includes a first repairing line, a second repairing line, an ESD releasing line, and an ESD protector. The first repairing line is intersected with one ends of the signal lines and is electrically floated. The ESD protector is electrically connected between the second repairing line and the ESD releasing line. The ESD protector includes a plurality of diodes that are connected in series. Each of the diodes includes a first electrode, a second electrode, a control electrode electrically connected to the second electrode, and a semiconductor layer, wherein the semiconductor layer is located between the first electrode and the second electrode. One of the first electrodes that is not electrically connected to the second electrode is electrically connected to the ESD releasing line, one of the second electrodes that is not electrically connected to the first electrode is electrically connected to the second repairing line, and the first repairing line is overlapped with one of the second electrodes. There are at least one welding point at where the first repairing line is intersected with one end of the signal line having the open defect, at least one welding point at where the second electrode is overlapped with the first repairing line, and at least one welding point at where a part of the control electrodes is overlapped with a part of the second electrodes, such that the second repairing line is electrically connected to the signal line having the open defect through the part of the control electrodes, the part of the second electrodes, and the first repairing line.

As described above, an active device array substrate provided by the present invention has a repairing structure, wherein the repairing structure protects the signal lines and repairing lines from ESD so that short circuit between the signal lines and the repairing lines is prevented. Thereby, both the production yield and display quality of the active device array substrate are improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
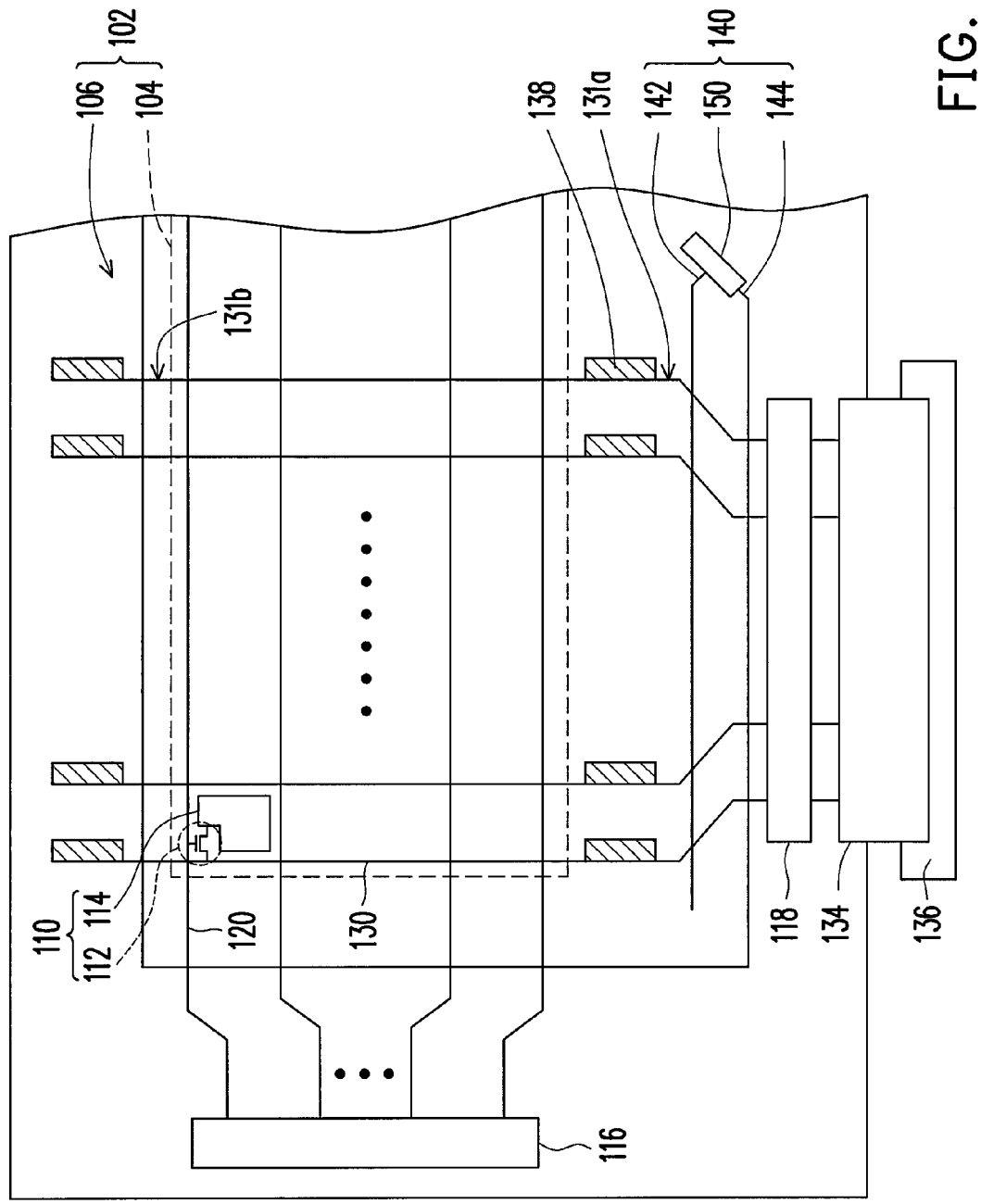
FIG. 1A is a top view of an active device array substrate according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
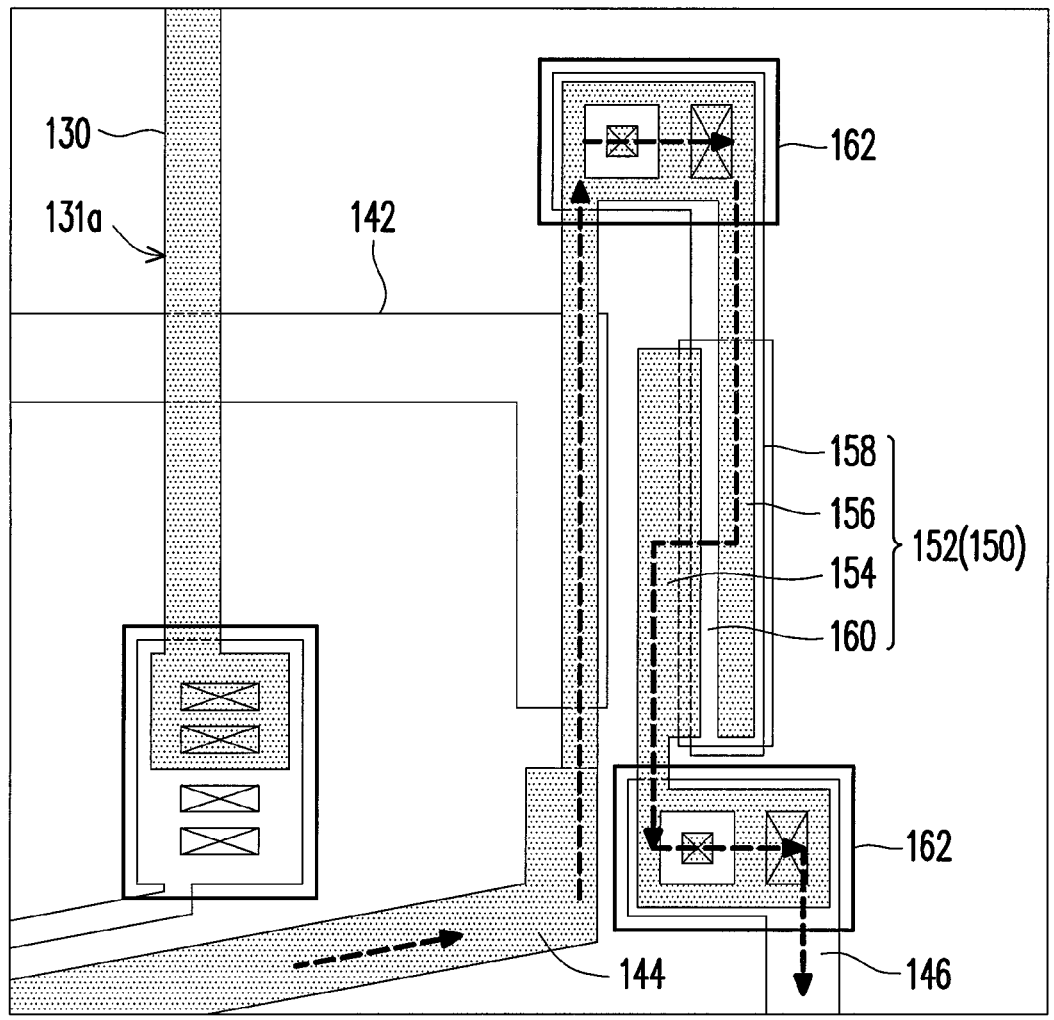
FIG. 1B is an enlarged view of a repairing structure in FIG. 1A.

FIG. 1A is a top view of an active device array substrate according to an embodiment of the present invention, and FIG. 1B is an enlarged view of a repairing structure in FIG. 1A. Referring to FIG. 1A, the active device array substrate 100 includes a substrate 102, a plurality of pixels 110, a plurality of scan lines 120, a plurality of data lines 130, and a repairing structure 140. The substrate 102 has a display region 104 and a periphery region 106. Referring to FIG. 1A, in the present embodiment, the area enclosed by the dotted lines is the display region 104, and the area from the dotted lines to the edges of the substrate 102 is the periphery region 106. The pixels 110 are arranged on the display region 104 of the substrate 102 as an array. A gate driving circuit 116 and a source driving circuit 118 are disposed in the periphery region 106. The pixels 110 include active devices (for example, transistors) 112 and pixel electrodes 114 electrically connected to the active devices 112. The scan lines 120 and the data lines 130 are disposed on the substrate 102 in an intersected manner and are respectively extended from the display region 104 to the periphery region 106. The gate driving circuit 116 and the source driving circuit 118 are respectively connected to the active devices 112 in the corresponding pixels 110 through the scan lines 120 and the data lines 130 so as to drive the pixels 110.

Referring to both FIG. 1A and FIG. 1B, the repairing structure 140 is disposed at the periphery region 106, and which includes a first repairing line 142, a second repairing line 144, an electrostatic discharge (ESD) releasing line 146, and an ESD protector 150. The first repairing line 142 is overlapped and intersected with one ends 131a of the data lines 130. The first repairing line 142 is electrically floated and electrically insulated from the data lines 130. The ESD protector 150 is connected between the second repairing line 144 and the ESD releasing line 146 (referring to FIG. 1B), and the ESD protector 150 is overlapped with and electrically insulated from the first repairing line 142. In the present embodiment, the ESD protector 150 includes at least one diode 152. The diode 152 includes a first electrode 154, a second electrode 156, a control electrode 158, and a semiconductor layer 160. The control electrode 158 and the second electrode 156 are electrically connected with each other through a conductive layer 162. The conductive layer 162 may be made of a transparent material (for example, indium tin oxide, aluminum tin oxide, indium zinc oxide, aluminium zinc oxide, hafnium oxide, another suitable material, or a combination of foregoing materials), a reflective material (for example, gold, silver, copper, tin, aluminum, molybdenum, titanium, tantalum, another suitable material, an alloy of foregoing materials, an nitride of foregoing materials, an oxide of foregoing materials, a nitrogen oxide of foregoing materials, or a combination of foregoing materials), or a combination of foregoing materials. In the present embodiment, the conductive layer 162 is assumed to be made of a transparent material. Thus, the conductive layer 162 may be referred to as a transparent conductive layer 162. However, the present invention is not limited thereto. The semiconductor layer 160 is located (disposed) between the first electrode 154 and the second electrode 156, for example, is located above a part of the control electrode 158 and connected between the first electrode 154 and the second electrode 156. In other embodiment, the semiconductor layer 160 is disposed (located) under a part of the control electrode 158 and is connected between the first electrode 154 and the second electrode 156. The first electrode 154 is electrically connected to the ESD releasing line 146 through the transparent conductive layer 162, and the ESD releasing line 146 is electrically connected to a common voltage or the ground, for example. The second electrode 156 is electrically connected to the second repairing line 144, for example. The second repairing line 144, for example, may be connected to a controller 136 through the source driving circuit 118 and a flexible circuit board 134, wherein the controller 136 may be a circuit control board. The second repairing line 144, for example, may also be connected to the flexible circuit board 134 through the source driving circuit 118.

In the present embodiment, the active device array substrate 100 may optionally further include an ESD protector 138. The ESD protector 138 is connected to the data lines 130 and is close to where the first repairing line 142 is intersected with the data lines 130. The ESD protector 138 may be a diode, but not limited it. It should be mentioned that the first repairing line 142 is intersected and overlapped with one ends of the data lines 130, the second repairing line 144 is intersected and overlapped with the other ends 131b of the data lines 130, and the second electrode 156 of the ESD protector 150 is overlapped with and electrically insulated from the first repairing line 142.

Generally speaking, ESD may be produced when the active device array substrate is manufactured or used, and which may affect the device characteristic or display quality of the active device array substrate. In particular, the ESD may cause short circuit between the signal lines and the repairing lines. Thus, in the present embodiment, the ESD protector 150 is disposed on the active device array substrate 100 for protecting the signal lines (for example, the data lines 130) and the first repairing line 142 from ESD. To be specific, when electrostatic charges are improperly accumulated or ESD is produced in the periphery region 106 of the active device array substrate 100, because of the ESD protector 150 disposed between the second repairing line 144 and the ESD releasing line 146, electrostatic charges can be conducted away through the second repairing line 144, the second electrode 156 and the first electrode 154 of the ESD protector 150, and the ESD releasing line 146 (please see with the arrow in the FIG. 1B). Accordingly, short circuit between the signal lines (for example, the data lines 130) and the first repairing line 142 caused by ESD is prevented, and both the production yield and display quality of the active device array substrate 100 are improved.

Figure 2A:
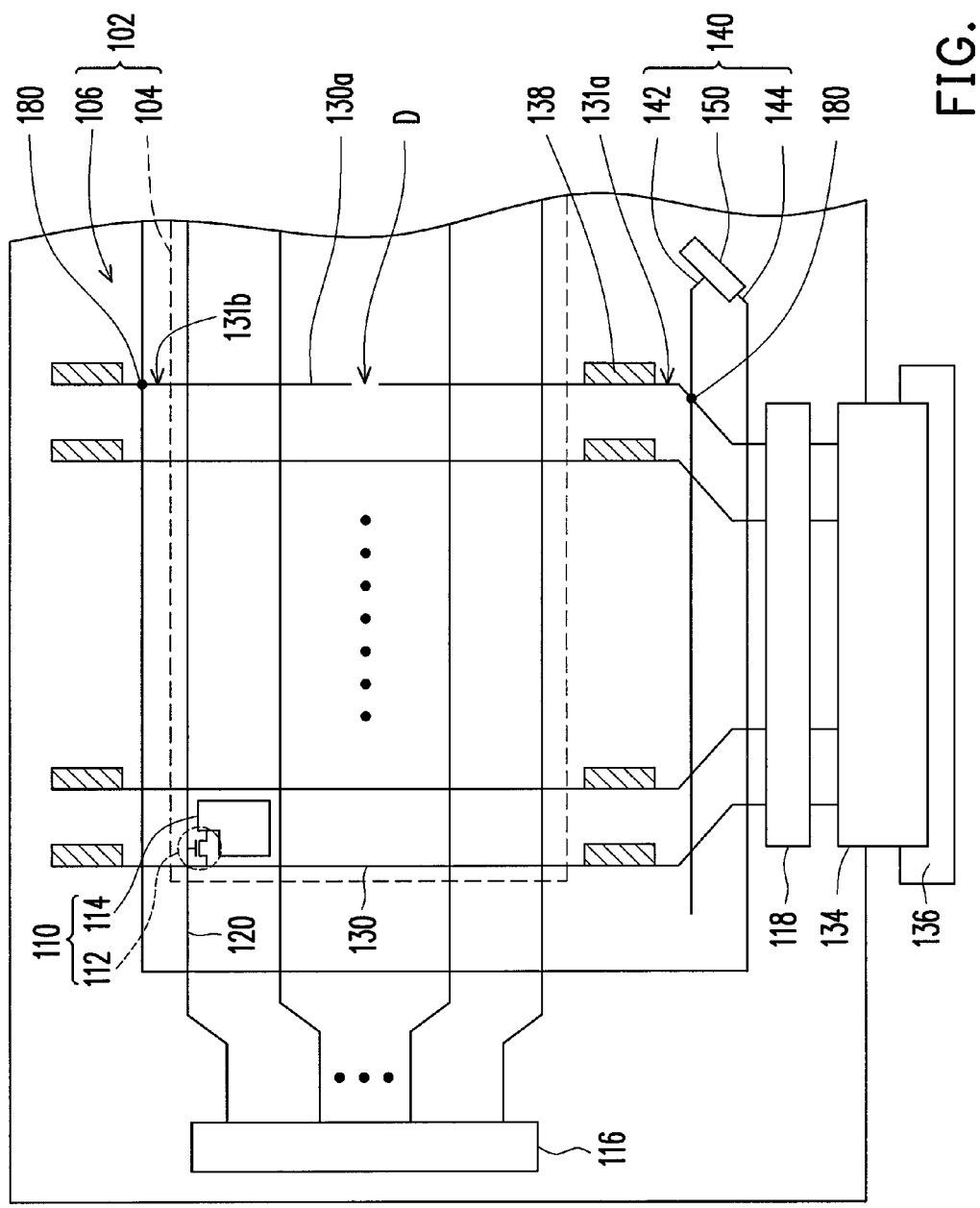
FIG. 2A is a top view of an active device array substrate according to an embodiment of the present invention.
Figure 2B:
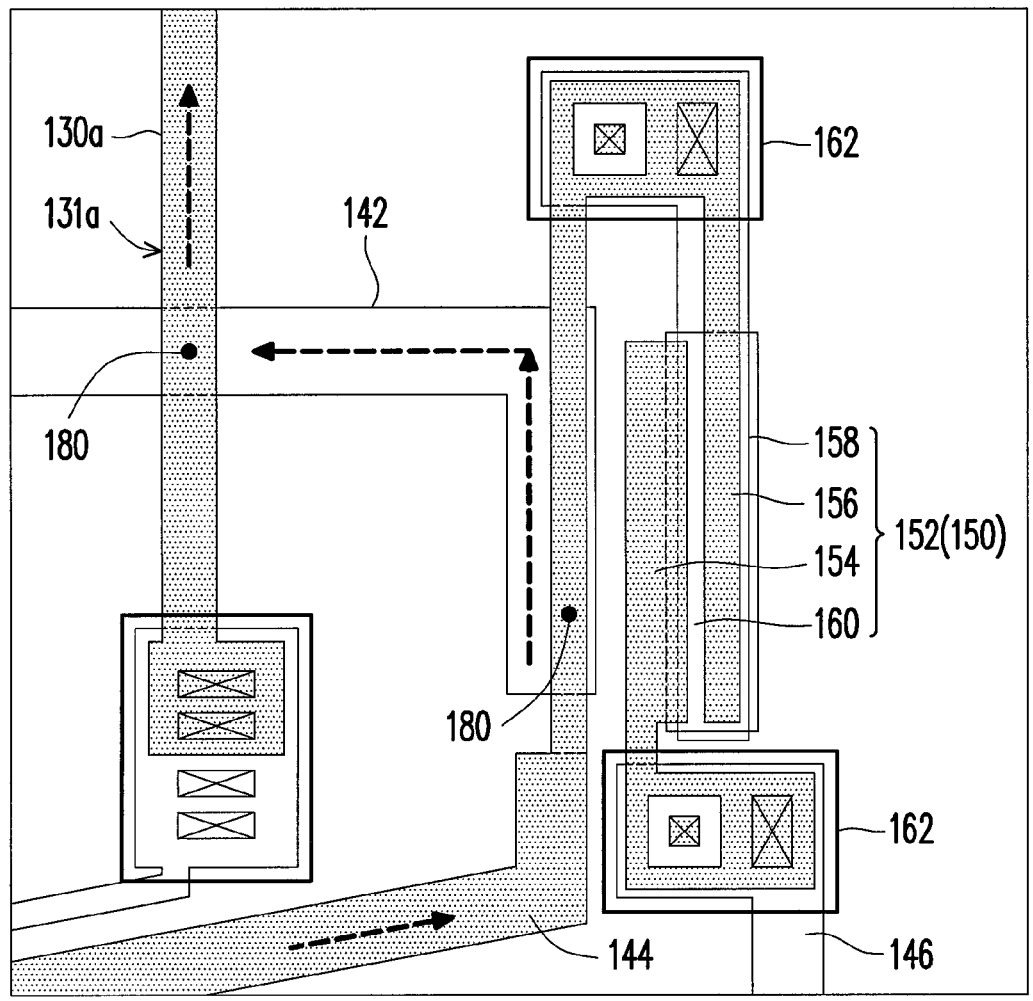
FIG. 2B is an enlarged view of a repairing structure in FIG. 2A.
Figure 3:
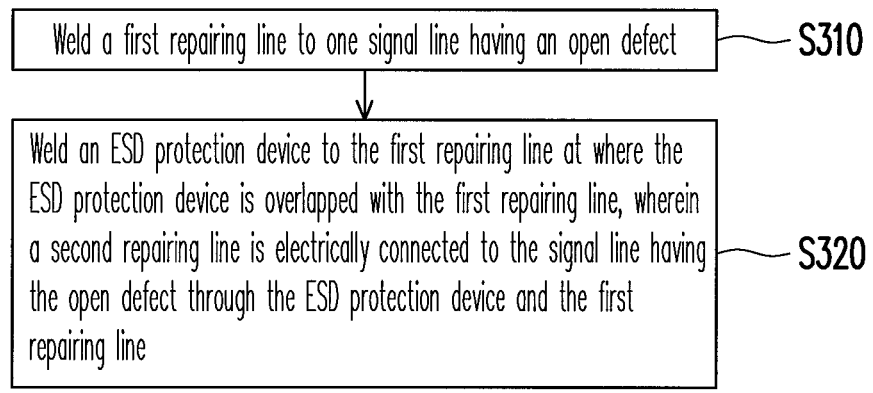
FIG. 3 is a flowchart of a repairing method suitable for repairing the active device array substrate in FIG. 1A according to an embodiment of the present invention.

FIG. 2A is a top view of an active device array substrate according to an embodiment of the present invention, and FIG. 2B is an enlarged view of a repairing structure in FIG. 2A. FIG. 3 is a flowchart of a repairing method suitable for repairing the active device array substrate in FIG. 1A according to an embodiment of the present invention. It should be noted that the active device array substrate 100a in FIG. 2A has substantially the same components as the active device array substrate 100 in FIG. 1A. However, in the active device array substrate 100a illustrated in FIG. 2A, one of the signal lines (for example, the data line 130a) has an open defect D therefore needs to be repaired by using the repairing structure 140 and the repairing method illustrated in FIG. 3.

Referring to FIG. 2A, FIG. 2B, and FIG. 3, first, in step S310, the first repairing line 142 is welded to the end 131a of the signal line (for example, the data line 130a) having the open defect D. In the present embodiment, the data line 130a of the active device array substrate 100a has the open defect D, the first repairing line 142 is overlapped with the end 131a of the data line 130a having the open defect D, and the second repairing line 144 is overlapped with another end 131b of the data line 130a having the open defect D. Thus, in the present embodiment, the overlap between the first repairing line 142 and the end 131a of the data line 130a are welded together through laser welding to form a welding point 180. Accordingly, the data line 130a having the open defect D is electrically connected to the first repairing line 142 through the welding point 180. Additionally, in the repairing method provided by the present embodiment, the overlap between the second repairing line 144 and the other end 131b of the data line 130a are also welded together to form a welding point 180.

Then, in step S320, the ESD protector 150 is welded to the first repairing line 142 at the overlap between the ESD protector 150 and the first repairing line 142, wherein the second repairing line 144 is electrically connected to the signal line (for example, the data line 130a) having the open defect D through the ESD protector 150 and the first repairing line 142. To be specific, in the present embodiment, the ESD protector 150 includes at least one diode 152, and the diode 152 includes a first electrode 154, a second electrode 156, a control electrode 158, and a semiconductor layer 160. The semiconductor layer 160 is disposed (located) between the first electrode 154 and the second electrode 156, for example, is disposed above the control electrode 158 and is connected between the first electrode 154 and the second electrode 156. In other embodiment, the semiconductor layer 160 is disposed (located) under a part of the control electrode 158 and is connected between the first electrode 154 and the second electrode 156. The overlap between the ESD protector 150 and the first repairing line 142 is the overlap between the second electrode 156 and the first repairing line 142. Thus, the overlap between portion of the ESD protector 150 and portion of the first repairing line 142 can be welded by welding the overlap between the second electrode 156 and the first repairing line 142, so that a welding point 180 is formed at the overlap between the second electrode 156 and the first repairing line 142.

Referring to FIG. 2A and FIG. 2B, in the present embodiment, the second electrode 156 is electrically connected to the second repairing line 144. Thus, after welding the overlap between the first repairing line 142 and the data line 130a, the overlap between the second repairing line 144 and the data line 130a, and the overlap between the second electrode 156 and the first repairing line 142, a signal can be transmitted to the end 131a of the data line 130a through the second repairing line 144, the second electrode 156 of the ESD protector 150, the welding point 180 at the overlap between the first repairing line 142 and the second electrode 156, the first repairing line 142, and the welding point 180 at the overlap between the data line 130a and the first repairing line 142 (please see with the arrow in the FIG. 2B). Because the second repairing line 144 is welded to the end 131b of the data line 130a through the welding point 180, the signal can be transmitted from the end 131a of the data line 130a having the open defect D to the other end 131b thereof through foregoing path. Accordingly, the data line 130a having the open defect D can remain connected through the repairing structure 140 and accordingly the corresponding pixels 110 can work properly.

Figure 4:
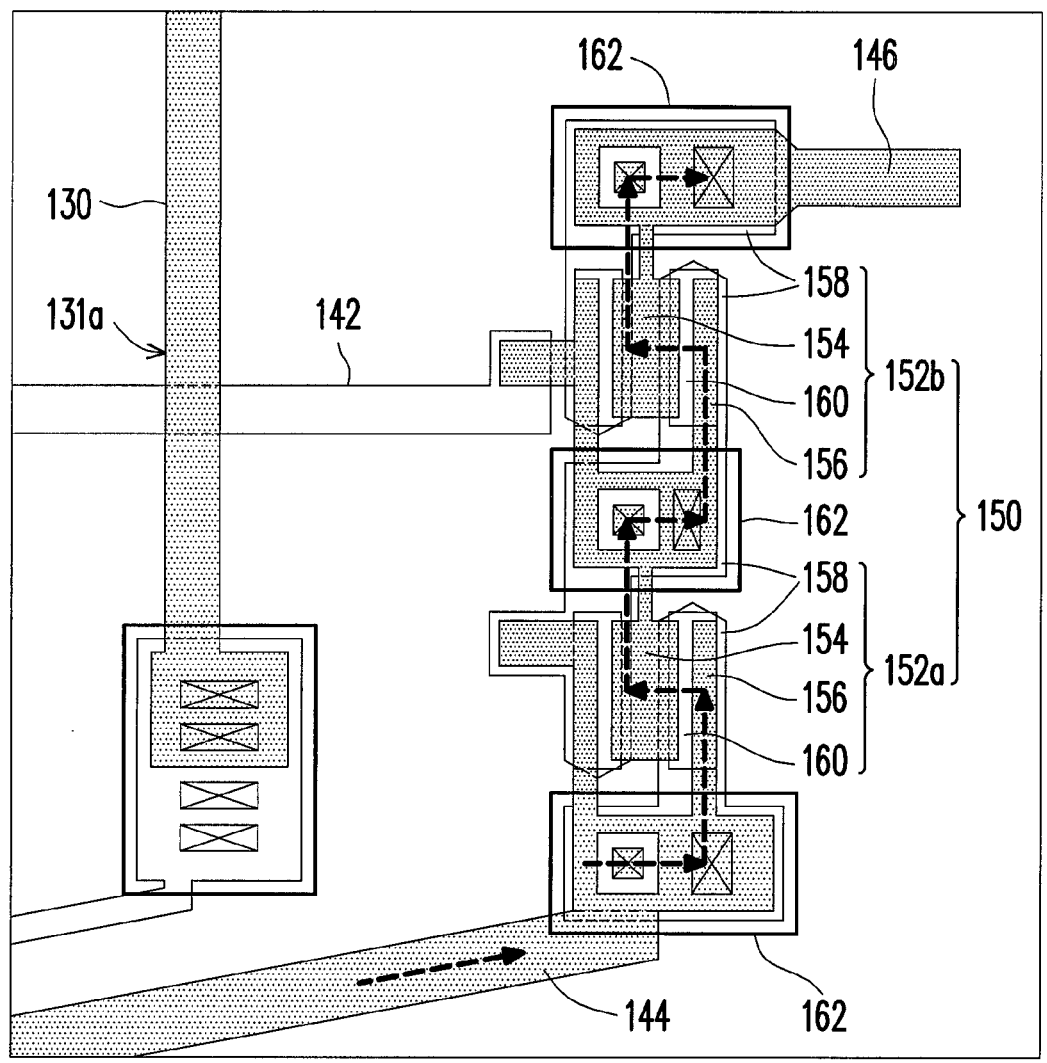
FIG. 4 is an enlarged view of another repairing structure of the active device array substrate in FIG. 1A.

In other embodiments, the second electrode 156 may also be connected to an ESD releasing line 146 as illustrated in FIG. 4. In the present embodiment, the second electrode 156 is not connected to the ESD releasing line 146 as shown in FIG. 4. However, the present invention is not limited thereto.

According to the embodiment described above, the repairing structures 140 of the active device array substrates 100 and 100a can protect the data lines 130 and the first repairing line 142 from ESD and repair the data line 130a having the open defect D. In other words, as shown in FIG. 1A and FIG. 1B, when the signal lines (for example, the data lines 130) are in a normal state, because the repairing structure 140 can effectively conduct electrostatic charges away, the signal lines (for example, the data lines 130) and the first repairing line 142 are protected from ESD therefore won't be short circuited. Thus, both the production yield and the display quality of the active device array substrate 100 are improved. In addition, as shown in FIG. 2A and FIG. 2B, when a signal line (for example, the data line 130a) has an open defect D, the repairing structure 140 can repair the signal line (for example, the data line 130a) so that the signal line having the open defect D can remain connected and accordingly the corresponding pixels 110 can work properly. In other words, the repairing structures 140 allow the active device array substrates 100 and 100a to have good device characteristic and improved display quality.

It should be noted that even though the repairing structure 140 is disposed at the end 131a of the data line 130a in the embodiment described above, the repairing structure 140 may also be disposed at the other end 131b or both ends 131a and 131b of the data line 130a. In addition, even though the repairing structure 140 is used for repairing the data lines 130 in the embodiment described above, those having ordinary knowledge in the art should understand that the repairing structure of the active device array substrate provided by the present invention may also be intersected with the scan lines for repairing any scan line with open defect. This application will not be described herein. Moreover, in the embodiment described above, the ESD protector 150 is assumed to include one diode 152. However, the ESD protector 150 may also include multiple diodes or diodes having other configurations.

FIG. 4 is an enlarged view of another repairing structure 140 of the active device array substrate in FIG. 1A. Referring to FIG. 4, in the present embodiment, the repairing structure 140 includes a first repairing line 142, a second repairing line 144, an ESD releasing line 146, and an ESD protector 150. The first repairing line 142 is intersected and overlapped with one end 131a of the data lines 130. The first repairing line 142 is electrically floated and electrically insulated from the data lines 130. The ESD protector 150 is connected between the second repairing line 144 and the ESD releasing line 146, and portion of the ESD protector 150 is overlapped with and electrically insulated from the first repairing line 142.

Referring to FIG. 4, in the present embodiment, the ESD protector 150 includes a plurality of diodes 152a and 152b that are connected in series. Each of the diodes 152a and 152b includes a first electrode 154, a second electrode 156, a control electrode 158, and a semiconductor layer 160. The control electrode 158 is electrically connected to the second electrode 156 through a conductive layer 162. The conductive layer 162 may be made of a transparent material (for example, indium tin oxide, aluminum tin oxide, indium zinc oxide, aluminium zinc oxide, hafnium oxide, another suitable material, or a combination of foregoing materials), a reflective material (for example, gold, silver, copper, tin, aluminum, molybdenum, titanium, tantalum, another suitable material, an alloy of foregoing materials, a nitride of foregoing materials, an oxide of foregoing materials, a nitrogen oxide of foregoing materials, or a combination of foregoing materials), or a combination of foregoing materials. In the present embodiment, the conductive layer 162 is assumed to be made of a transparent material. Thus, the conductive layer 162 may be referred to as a transparent conductive layer 162. However, the present invention is not limited thereto. The semiconductor layer 160 is located (disposed) between the first electrode 154 and the second electrode 156, for example, is located above a part of the control electrode 158 and connected between the first electrode 154 and the second electrode 156. In other embodiment, the semiconductor layer 160 is disposed (located) under a part of the control electrode 158 and is connected between the first electrode 154 and the second electrode 156. The first electrode 154 of the diode 152a is connected to the second electrode 156 of the diode 152b, so that the diode 152a and the diode 152b are connected in series. Besides, one of the first electrodes 154 (i.e., the first electrode 154 of the diode 152b) that is not electrically connected to the second electrode 156 is electrically connected to the ESD releasing line 146 through the transparent conductive layer 162, and the ESD releasing line 146 is electrically connected to a common voltage or the ground, for example. One of the second electrodes 156 (i.e., the second electrode 156 of the diode 152a) that is not electrically connected to the first electrode 154 is electrically connected to the second repairing line 144, and the second repairing line 144 is connected to a controller 136, wherein the controller 136 may be a circuit control board or a flexible circuit board.

In the present embodiment, the first repairing line 142 is intersected and overlapped with one ends 131a of the data lines 130, the second repairing line 144 is intersected and overlapped with the other ends 131b of the data lines 130, portion of the second electrode 156 (i.e., the second electrode 156 of the diode 152b) is overlapped with the first repairing line 142, and the control electrode 158 (i.e., the control electrode 158 of the diode 152a) is overlapped with the second electrode 156 (i.e., the second electrode 156 of the diode 152b).

Referring to both FIG. 1A and FIG. 4, when electrostatic charges are improperly accumulated or ESD occurs in the periphery region 106 of the active device array substrate 100, because of the ESD protector 150 disposed between the second repairing line 144 and the ESD releasing line 146, the electrostatic charges are conducted away through the second repairing line 144, the second electrode 156 of the diode 152a, the first electrode 154 of the diode 152a, the second electrode 156 of the diode 152b, and the first electrode 154 of the diode 152b in the ESD protector 150, and the ESD releasing line 146 (please see with the arrow in the FIG. 4). Accordingly, short circuit between the signal lines (for example, the data lines 130) and the first repairing line 142 caused by ESD is prevented, and both the production yield and display quality of the active device array substrate 100 are improved.

Figure 5:
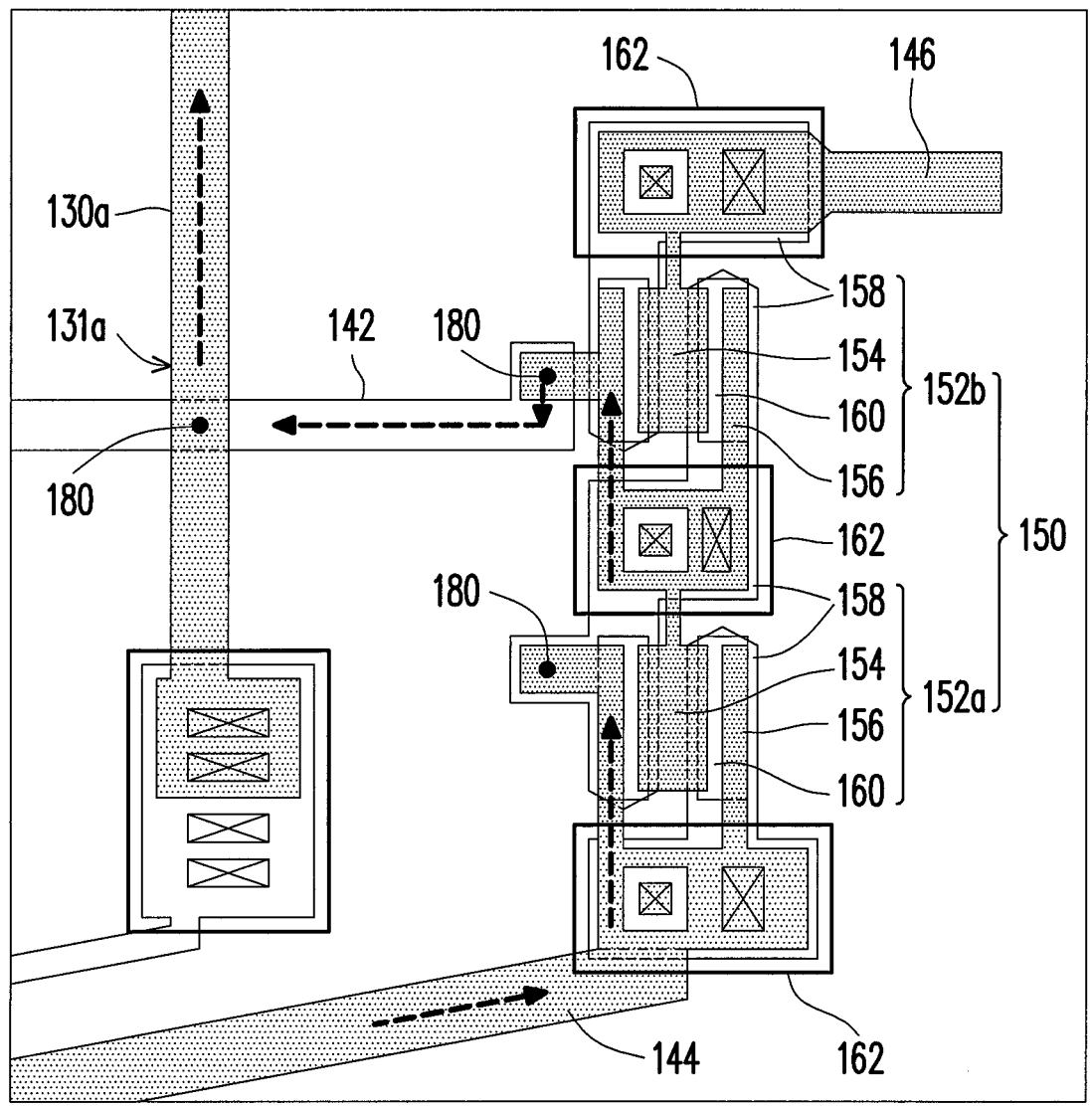
FIG. 5 is an enlarged view of another repairing structure of the active device array substrate in FIG. 2A.
Figure 6:
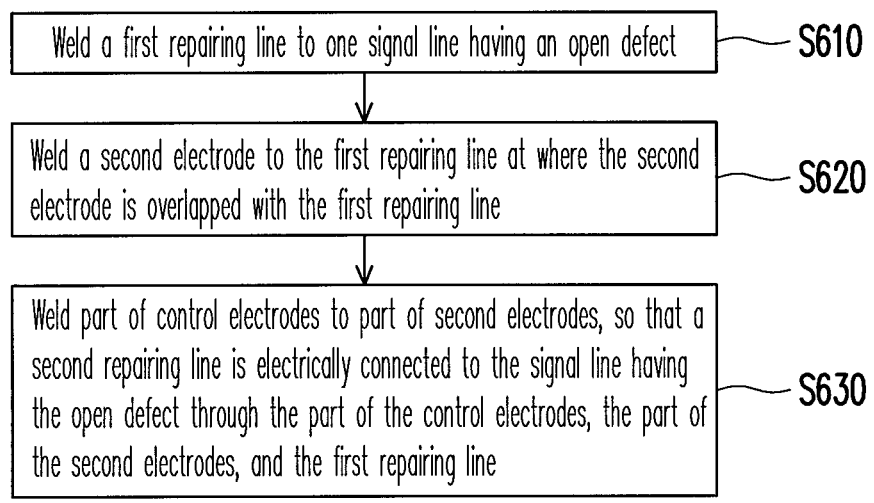
FIG. 6 is a flowchart of a repairing method suitable for repairing an active device array substrate having the repairing structure in FIG. 5 according to an embodiment of the present invention.

FIG. 5 is an enlarged view of another repairing structure 140 of the active device array substrate in FIG. 2A. FIG. 6 is a flowchart of a repairing method suitable for repairing the active device array substrate 100a having the repairing structure 140 in FIG. 5 according to an embodiment of the present invention. Referring to both FIG. 2A and FIG. 5, in the present embodiment, one of the signal lines (for example, the data line 130a) of the active device array substrate 100a has an open defect D therefore needs to be repaired through the repairing method illustrated in FIG. 6 by using the repairing structure 140 illustrated in FIG. 5.

Referring to FIG. 2A, FIG. 5, and FIG. 6, first, in step S610, the first repairing line 142 is welded to the end 131a of the signal line (for example, the data line 130a) having the open defect D. In the present embodiment, one data line 130a of the active device array substrate 100a has the open defect D, the first repairing line 142 is overlapped with the end 131a of the data line 130a having the open defect D, and the second repairing line 144 is overlapped with the other end 131b of the data line 130a having the open defect D. Thus, in the present embodiment, the overlap between the first repairing line 142 and the end 131a of the data line 130a are welded together through laser welding to form a welding point 180. Accordingly, the data line 130a having the open defect D is electrically connected to the first repairing line 142 through the welding point 180. Besides, in the present embodiment, the repairing method further includes welding the overlap between the second repairing line 144 and the other end 131b of the data line 130a to form a welding point 180.

Then, in step S620, the second electrode 156 is welded to the first repairing line 142 at the overlap between the second electrode 156 and the first repairing line 142. In the present embodiment, the second electrode 156 of the diode 152b is overlapped with the first repairing line 142. Thus, in this step, the second electrode 156 of the diode 152b is welded to the first repairing line 142 through laser welding to form a welding point 180.

Next, in step S630, a part of the control electrode 158 and a part of the second electrode 156 are welded together so that the second repairing line 144 is electrically connected to the signal line (for example, the data line 130a) having the open defect D through the part of the control electrode 158, the part of the second electrode 156, and the first repairing line 142. In the present embodiment, the ESD protector 150 includes a plurality of diodes 152a and 152b that are connected in series. Each of the diodes 152a and 152b includes a first electrode 154, a second electrode 156, a control electrode 158, and a semiconductor layer 160. The control electrode 158 of the diode 152a is overlapped with the second electrode 156 of the diode 152a. Thus, in this step, a part of the control electrode 158 and a part of the second electrode 156 are welded together by welding the control electrode 158 of the diode 152a to the second electrode 156 of the diode 152a, so as to form a welding point 180. Because the control electrode 158 of the diode 152a is electrically connected to the second electrode 156 of the diode 152b, the second electrode 156 of the diode 152a is electrically connected to the control electrode 158 of the diode 152a through the welding point 180 and further electrically connected to the second electrode 156 of the diode 152b.

Referring to FIG. 2A and FIG. 5, in the present embodiment, the second electrode 156 of the diode 152a is electrically connected to the second repairing line 144. Thus, after welding the overlap between the first repairing line 142 and the data line 130a, the overlap between the second electrode 156 of the diode 152b and the first repairing line 142, and the control electrode 158 of the diode 152a and the second electrode 156 of the diode 152a, a signal can be transmitted to the end 131a of the data line 130a through the second repairing line 144, the second electrode 156 of the diode 152a of the ESD protector 150, the welding point 180 at the overlap between the control electrode 158 of the diode 152a and the second electrode 156 of the diode 152a, the control electrode 158 of the diode 152a of the ESD protector 150, the second electrode 156 of the diode 152b of the ESD protector 150, the welding point 180 at the overlap between the first repairing line 142 and the second electrode 156 of the diode 152b, the first repairing line 142, and the welding point 180 at the overlap between the data line 130a and the first repairing line 142. Since the second repairing line 144 has been welded to the end 131b of the data line 130a through the welding point 180, the signal can be transmitted from the end 131a of the data line 130a having the open defect D to the other end 131b thereof through foregoing path. Accordingly, the data line 130a having the open defect D can remain connected through the repairing structure 140 and accordingly the corresponding pixels 110 can work properly.

Additionally, in other embodiments, the second electrode 156 of the diode 152b may not be connected to the ESD releasing line 146, as in the design illustrated in FIG. 2. In the present embodiment, the second electrode 156 of the diode 152b is assumed to be connected to the ESD releasing line 146 but the present invention is not limited thereto.

According to the embodiments described above, the repairing structures 140 of the active device array substrates 100 and 100a can protect the data lines 130 and the first repairing line 142 from ESD and repair the data line 130a having an open defect. In other words, as shown in FIG. 1A and FIG. 4, when the signal lines (for example, the data lines 130) are in a normal state, because the repairing structure 140 can effectively conduct the electrostatic charges away, short circuit between the signal lines (for example, the data lines 130) and the first repairing line 142 caused by ESD is prevented. Thereby, both the production yield and the display quality of the active device array substrate 100 are improved. Moreover, as shown in FIG. 2A and FIG. 5, when a signal line (for example, the data line 130a) has an open defect D, the repairing structure 140 can repair the signal line (for example, the data line 130a) so that the signal line having the open defect can remain connected and accordingly the corresponding pixels 110 can work properly. In other words, the repairing structures 140 allows the active device array substrates 100 and 100a to have improved device characteristic and better display quality.

It should be noted that even though the repairing structure 140 is disposed at the end 131a of the data line 130a in foregoing embodiments, the repairing structure 140 may also be disposed at the other end 131b or both ends 131a and 131b of the data line 130a. In addition, even though the repairing structure 140 is only used for repairing the data lines 130 in foregoing embodiment, those having ordinary knowledge in the art should understand that the repairing structure of the active device array substrate in the present invention may also be intersected with the scan lines and used for repairing any scan line having an open defect. Furthermore, in the embodiment described above, the ESD protector 150 includes two diodes 152. However, the ESD protector 150 may also include more than two diodes that are connected in series or diodes having other configurations.

In summary, an active device array substrate provided by the present invention has a repairing structure, wherein the repairing structure can effectively conduct electrostatic charges away. Thus, when electrostatic charges are improperly accumulated or ESD occurs in the periphery region of the active device array substrate, the repairing structure can protect the signal lines and the repairing lines from ESD and prevent the occurrence of any short circuit between the signal lines and the repairing lines. Namely, the active device array substrate in the present invention offers improved device characteristic and is protected from ESD. Thereby, a display panel adopting the active device array substrate has improved display quality and is protected from ESD.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device array substrate, comprising:

a substrate having a display region and a periphery region;
a plurality of pixels arranged in array and disposed on the display region of the substrate;
a plurality of signal lines electrically connected to the pixels and respectively extended from the display region to the periphery region; and
a repairing structure disposed at the periphery region, the repairing structure comprising:
a first repairing line intersected with one ends of the signal lines, wherein the first repairing line is electrically floated;
a second repairing line;
an electrostatic discharge (ESD) releasing line; and
an ESD protector connected between the second repairing line and the ESD releasing line, wherein the ESD protector is overlapped with and electrically insulated from the first repairing line.

2. The active device array substrate according to claim 1, wherein the signal lines comprise a plurality of scan lines and a plurality of data lines, and the scan lines are intersected with the data lines.

3. The active device array substrate according to claim 1, wherein the ESD releasing line is electrically connected to a common voltage.

4. The active device array substrate according to claim 1, wherein the ESD releasing line is grounded.

5. The active device array substrate according to claim 1, wherein the ESD protector comprises at least one diode, and the diode comprises:
a first electrode;
a second electrode;
a control electrode electrically connected to the second electrode; and
a semiconductor layer located between the first electrode and the second electrode.

6. The active device array substrate according to claim 5, wherein the first electrode is electrically connected to the ESD releasing line, the second electrode is electrically connected to the second repairing line, and the second electrode is overlapped with and electrically insulated from the first repairing line.

7. The active device array substrate according to claim 1, wherein the ESD protector comprises a plurality of diodes that are connected in series, each of the diodes comprises a first electrode, a second electrode, a control electrode electrically connected to the second electrode, and a semiconductor layer, and the semiconductor layer is located between the first electrode and the second electrode.

8. The active device array substrate according to claim 7, wherein one of the first electrodes that is not electrically connected to the second electrode is electrically connected to the ESD releasing line, one of the second electrodes that is not electrically connected to the first electrode is electrically connected to the second repairing line, and the first repairing line is overlapped with one of the second electrodes.

9. A repairing method, suitable for repairing the active device array substrate in claim 8, when an open defect is occurred on one of the signal lines, the repairing method comprises:
welding the first repairing line to one end of the signal line having the open defect;
welding the second electrode to the first repairing line at where the second electrode is overlapped with the first repairing line; and
welding a part of the control electrodes to a part of the second electrodes so that the second repairing line is electrically connected to the signal line having the open defect through the part of the control electrodes, the part of the second electrodes, and the first repairing line.

10. The active device array substrate according to claim 1, wherein the second repairing line is connected to a controller.

11. The active device array substrate according to claim 1 further comprising another ESD protector, wherein the another ESD protector is connected to the signal lines and is close to where the first repairing line is intersected with the signal lines.

12. A repairing method, suitable for the active device array substrate in claim 1, when an open defect is occurred on one of the signal lines, the repairing method comprises:
welding the first repairing line to one end of the signal line having the open defect; and
welding the ESD protector to the first repairing line at where the ESD protector is overlapped with the first repairing line, wherein the second repairing line is electrically connected to the signal line having the open defect through the ESD protector and the first repairing line.

13. The repairing method according to claim 12, wherein the ESD protector comprises at least one diode, the diode comprises a control electrode, a first electrode, a second electrode, and a semiconductor layer, the semiconductor layer is disposed between the first electrode and the second electrode, and an overlap between the ESD protector and the first repairing line is an overlap between the second electrode and the first repairing line.

14. An active device array substrate, comprising:
a substrate having a display region and a periphery region;
a plurality of pixels arranged in an array and disposed on the display region of the substrate;
a plurality of signal lines electrically connected to the pixels, and respectively extended from the display region to the periphery region, wherein one of the signal lines has an open defect; and
a repairing structure disposed at the periphery region, the repairing structure comprising:
a first repairing line intersected with one ends of the signal lines,
wherein the first repairing line is electrically floated;
a second repairing line;
an ESD releasing line;
an ESD protector, electrically connected between the second repairing line and the ESD releasing line, wherein the ESD protector is overlapped with and electrically insulated from the first repairing line, there are at least one welding point at where the first repairing line is overlapped with one end of the signal line having the open defect and at least one welding point at where the ESD protector is overlapped with the first repairing line, such that the second repairing line is electrically connected to the signal line having the open defect through the ESD protector and the first repairing line.

15. The active device array substrate according to claim 14, wherein the ESD protector comprises at least one diode, the diode comprises a control electrode, a first electrode, a second electrode, and a semiconductor layer, the semiconductor layer is disposed between the first electrode and the second electrode, an overlap between the ESD protector and the first repairing line is an overlap between the second electrode and the first repairing line, and the welding point is located at the overlap.

16. The active device array substrate according to claim 14 further comprising another ESD protector, wherein the another ESD protector is connected to the signal lines and is close to where the first repairing line is intersected with the signal lines.

17. An active device array substrate, comprising:
- a substrate having a display region and a periphery region;
- a plurality of pixels arranged in an array and disposed on the display region of the substrate;
- a plurality of signal lines electrically connected to the pixels, and respectively extended from the display region to the periphery region, wherein one of the signal lines has an open defect; and
- a repairing structure, disposed at the periphery region, the repairing structure comprising:
  - a first repairing line, intersected with one ends of the signal lines,
- wherein the first repairing line is electrically floated;
  - a second repairing line;
  - an ESD releasing line; and
  - an ESD protector, electrically connected between the second repairing line and the ESD releasing line, wherein the ESD protector comprises a plurality of diodes that are connected in series, each of the diodes comprises a first electrode, a second electrode, a control electrode electrically connected to the second electrode, and a semiconductor layer, the semiconductor layer is located between the first electrode and the second electrode, one of the first electrodes that is not electrically connected to the second electrode is electrically connected to the ESD releasing line, one of the second electrodes that is not electrically connected to the first electrode is electrically connected to the second repairing line, and the first repairing line is overlapped with one of the second electrodes;

wherein there are at least one welding point at where the first repairing line is intersected with one end of the signal line having the open defect, at least one welding point at where the second electrode is overlapped with the first repairing line, and at least one welding point at where a part of the control electrodes is overlapped with a part of the second electrodes, such that the second repairing line is electrically connected to the signal line having the open defect through the part of the control electrodes, the part of the second electrodes, and the first repairing line.

18. The active device array substrate according to claim 17 further comprising another ESD protector, wherein the another ESD protector is connected to the signal lines and is close to where the first repairing line is intersected with the signal lines.

* * * * *